United States Patent [19]
Geib

[11] Patent Number: 5,448,194
[45] Date of Patent: Sep. 5, 1995

[54] CIRCUIT FOR THE BUFFER STORAGE OF A BIT, AND USE OF THE CIRCUIT AS AN ADDRESS BUFFER STORE

[75] Inventor: Heribert Geib, Grafing, Germany

[73] Assignee: Siemens Aktiengesellschaft, Munich, Germany

[21] Appl. No.: 290,801

[22] Filed: Aug. 17, 1994

[30] Foreign Application Priority Data

Feb. 21, 1992 [DE] Germany ............... 42 05 339.0

[51] Int. Cl.⁶ ............................................. H03K 3/356
[52] U.S. Cl. ................................. 327/208; 327/200; 327/211; 327/219; 327/415
[58] Field of Search ............... 327/415, 200, 211, 219, 327/208

[56] References Cited

U.S. PATENT DOCUMENTS

| | | | |
|---|---|---|---|
| 4,156,940 | 5/1979 | Hollingsworth et al. | 365/189 |
| 4,754,165 | 6/1988 | Cornish | 307/279 |
| 5,003,513 | 3/1991 | Porter et al. | 365/230.08 |
| 5,073,873 | 12/1991 | Nogami | 365/189.05 |
| 5,204,560 | 4/1993 | Bredin et al. | 327/208 |
| 5,347,173 | 9/1994 | McAdams | 327/208 |
| 5,349,243 | 9/1994 | McClure | 327/208 |
| 5,396,108 | 3/1995 | McClure | 327/208 |

FOREIGN PATENT DOCUMENTS

| | | |
|---|---|---|
| 0262411 | 6/1988 | European Pat. Off. |
| 0361807 | 4/1990 | European Pat. Off. |
| 0478252 | 1/1992 | European Pat. Off. |

OTHER PUBLICATIONS

"Row Address Buffer and Decoder Circuits for CMOS Dynamic RAM", IBM Technical Disclosure Bulletin, vol. 28, No. 1, Jun. 1985, pp. 421–425.

Primary Examiner—Margaret R. Wambach
Attorney, Agent, or Firm—Hill, Steadman & Simpson

[57] ABSTRACT

A storage element is provided in a circuit arrangement for latching one bit. A first MOS transistor (T1) is provided which, when a first control signal (S1) is present, switches an input signal corresponding to the bit to the input of the storage element. The storage element is provided with circuit elements by which an output signal at the output of the storage element is brought to a predetermined potential in dependence on the level of the input signal. The circuit arrangement is particularly suitable for constructing an address latch for DRAMs, particularly of the 16-M generation.

4 Claims, 1 Drawing Sheet

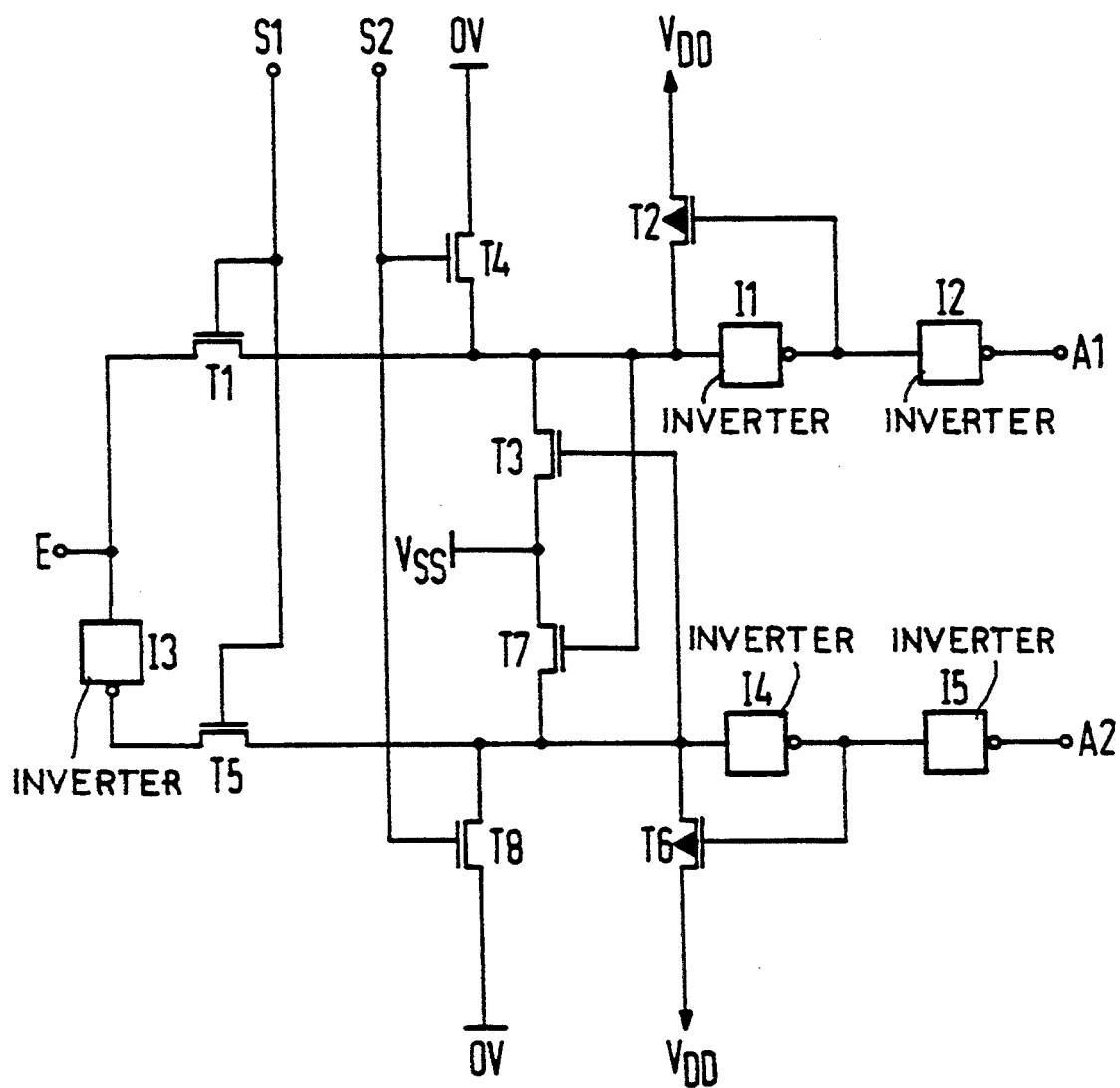

CIRCUIT FOR THE BUFFER STORAGE OF A BIT, AND USE OF THE CIRCUIT AS AN ADDRESS BUFFER STORE

BACKGROUND OF THE INVENTION

For addressing individual DRAM storage cells in memory chips, bits are applied to the address inputs of the memory chip. To ensure that changes at the address input do not exert any influence on the address after a valid address has been applied, the bit corresponding to the address is latched. As a rule, the signal is converted to CMOS level in this process.

After the latching of the applied bit, the address inputs are disconnected from the other signal path.

A circuit arrangement used in this connection is designated as an address latch. It is used for row addresses, column addresses and in the field of entering data.

European Patent Application EP 0 361 807 A2 discloses a shift register which is controlled with the aid of two phase signals. The shift register comprises two modules which are essentially identical and are interconnected in series between the input and output, each module comprising four transistors and requiring only one phase signal in each case.

A storage arrangement having a voltage generator is disclosed in U.S. Pat. No. 4,156,940. The storage contents are read out in the arrangement via a transistor whose impedance is controlled in the switched-on state via a level which is made available by a voltage divider.

A static MOS latch is disclosed in U.S. Pat. No. 4,754,165. The arrangement comprises an output and an inverted output, which are tapped in each case between two series-connected MOS transistors which are connected in series between the higher voltage level and the lower voltage level. The MOS transistors connected in series are acted upon in each case by an input and an inverted input, with the result that when a signal corresponding to the higher level is present the output is connected to the voltage corresponding to the higher level and the inverted output is simultaneously connected to the voltage corresponding to the lower level, and vice versa.

The older European Patent Application EP 0 478 252 A2 (corresponding to U.S. Pat. No. 5,128,897), which is not a prior publication, discloses a storage arrangement which comprises, inter alia, address latches. An input signal is applied in the address latch via an NOR element to the input of a storage element.

SUMMARY OF THE INVENTION

The invention is based on the problem of specifying a circuit arrangement for latching one bit, which arrangement is constructed with the least possible number of transistors and therefore has little space requirement.

According to the invention, the problem is solved by a circuit arrangement for latching one bit, in which two circuit branches are provided which have a common input. A first circuit branch has a first MOS transistor and a first inverter, which are connected in series between the input and a first output. When a first control signal is present, the first MOS transistor switches an input signal corresponding to the bit to the input of the first inverter. A second MOS transistor which is a p-channel transistor and which is acted upon by the output of the first inverter, is switched between the input of the first inverter and a first supply voltage source which supplies a first potential corresponding to a higher level. A third MOS transistor, which is an n-channel transistor, is switched between the input of the first inverter and a second supply voltage source which supplies a potential corresponding to a low level. A fourth MOS transistor is provided which clears a signal present at the input of the first inverter when a second control signal is present. The second circuit branch has a third inverter, a fifth MOS transistor and a fourth inverter, which are connected in series between the input and a second output. The fifth MOS transistor is acted upon by the first control signal and, when the first control signal is present, connects the output of the third inverter to the input of the fourth inverter. A sixth MOS transistor, which is a p-channel transistor and which is acted upon by the output of the fourth inverter, is switched between the input of the fourth inverter and the first supply voltage source. A seventh MOS transistor, which is an n-channel transistor, is switched between the input of the fourth inverter and the second supply voltage source. An eighth MOS transistor is provided, which is acted upon by the second control signal and which, when the second control signal is present, clears a signal present at the input of the fourth inverter. The gate of the third MOS transistor is connected to the input of the fourth inverter and to the sixth MOS transistor. The gate of the seventh MOS transistor is connected to the input of the first inverter and to the second MOS transistor.

A second inverter is switched between the output of the first inverter and the first output and a fifth inverter is switched between the output of the fourth inverter and the second output.

The first MOS transistor, the fourth MOS transistor, the fifth MOS transistor and the eighth MOS transistor are each n-channel transistors.

The circuit arrangement can be used as an address latch.

In the circuit arrangement according to the invention, the input is connected via a single transistor, for example an NMOS transistor, to the storage element in which the bit is latched. The storage element comprises means by which an output signal at the output of the storage element is brought to a predetermined potential in dependence on the level of an input signal corresponding to the bit. In this manner, a loss in signal amplitude of the input signal is compensated for when a logic 1 is switched through at the first transistor.

The storage element comprises, for example, an inverter and a PMOS transistor, the gate electrode of which is acted upon by the inverted signal itself and which, in the conducting state, connects the input of the inverter to a supply voltage source which supplies a potential corresponding to the higher level.

It is within the scope of the invention to provide a further NMOS transistor which is acted upon by the inverted input signal and which, in the conducting state, connects the input of the storage element to a supply voltage source which supplies a potential corresponding to the low level. In this manner, disturbances in the output signal are also compensated for when the input signal assumes the value of a logic 0.

It is within the scope of the invention to construct an address latch from two circuit arrangements according to the invention. One circuit arrangement is supplied with the digital input signal via an inverter. Both circuit arrangements are jointly acted upon by the first control signal. At the output of the address latch, an output signal and an inverted output signal are available.

By constructing the circuit according to the invention with an NMOS transistor at the address input and a PMOS transistor and an inverter as storage element, only the first control signal is required for switching the bit to the input of the storage element.

In the embodiment comprising the NMOS transistors, it is advantageous for the gate electrodes of the NMOS transistors to be acted upon crosswise by the input signal and the inverted input signal for removing noise from the low level in the address latch. This ensures higher noise immunity.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The single FIGURE shows a circuit arrangement for latching a digital signal.

DESCRIPTION OF THE PREFERRED EMBODIMENT

An input E is connected to the first terminal of a first MOS transistor T1. The first MOS transistor T1 is, for example, an n-channel transistor. The gate electrode of the first MOS transistor T1 is acted upon by a first control signal S1.

A second MOS transistor T2 is provided, the first terminal of which is connected to a first supply voltage source VDD. The second terminal of the second MOS transistor T2 is connected to the second terminal of the first MOS transistor T1. The second MOS transistor T2 is a p-channel transistor.

A first inverter I1 is provided, the input of which is connected to the second terminal of the first MOS transistor T1 and of the second MOS transistor T2. The output of the first inverter I1 is connected to the gate electrode of the second MOS transistor T2.

Since the second MOS transistor T2 is a p-channel transistor, the second MOS transistor T2 conducts when the input signal at the second terminal of the first MOS transistor T1 has the higher level and consequently the lower level is present at the output of the first inverter I1. In this case, the potential at the input of the first inverter I1 is pulled to the potential of the supply voltage VDD via the second MOS transistor T2. As a result, the loss of an operating voltage across the first MOS transistor T1 is compensated for if a "1" is present at the input.

The output of the first inverter I1 is connected to the input of a second inverter I2. The output of the second inverter I2 is connected to an output A1. At the output A1, an output signal is available which corresponds to the input signal.

A third MOS transistor T3 is provided which is an n-channel transistor and the first terminal of which is connected to the second terminal of the first MOS transistor and the second terminal of which is connected to a second supply voltage source $V_{SS}$ which has a potential corresponding to the low level of the output signal, the gate electrode of the third MOS transistor T3 being acted upon by the inverted input signal.

A fourth MOS transistor T4 is provided which is, for example, an n-channel transistor. The first terminal of the fourth MOS transistor T4 is connected to the second terminal of the first MOS transistor T1. The second terminal of the fourth MOS transistor T4 is connected to earth potential. A second control signal S2 is applied via the gate electrode of the fourth MOS transistor T4.

In parallel with the first MOS transistor T1, the input E is connected to a third inverter I3. The output of the third inverter I3 is connected to the first terminal of a fifth MOS transistor T5. The fifth MOS transistor T5 is also, for example, an n-channel transistor. The gate electrode of the fifth MOS transistor T5 is also acted upon by the first control signal S1.

A sixth MOS transistor T6 is provided which is also a p-channel transistor. The first terminal of the sixth MOS transistor T6 is connected to the first supply voltage source VDD. The second terminal of the sixth MOS transistor T6 is connected to the second terminal of the fifth MOS transistor T5.

A fourth inverter I4 is provided, the input of which is connected to the second terminal of the fifth MOS transistor T5 and to the second terminal of the sixth MOS transistor T6. The output of the fourth inverter I4 is connected to the gate electrode of the sixth MOS transistor T6.

Since the sixth MOS transistor T6 is a p-channel transistor, the sixth MOS transistor T6 conducts when a low voltage level is present at the output of the fourth inverter I4 and thus a signal having a high voltage level is present at the input of the fourth inverter I4. When a logic 1 is switched through, it is therefore pulled to the potential of the supply voltage VDD via the sixth MOS transistor T6.

A fifth inverter I5 is provided, the input of which is connected to the output of the fourth inverter I4. The output of the fifth inverter I5 is connected to an inverted output A2. At the inverted output A2, the inverted output signal is present with respect to the output A1.

A seventh MOS transistor T7 is provided. The seventh MOS transistor T7 is an n-channel transistor. The second terminal of the fifth MOS transistor T5 is connected to the first terminal of the seventh MOS transistor T7. The second terminal of the seventh MOS transistor T7 is connected to the second supply voltage source VSS. The gate electrode of the seventh MOS transistor T7 is acted upon by the digital input signal. The gate electrode of the seventh MOS transistor T7 is connected to the first terminal of the third MOS transistor T3. The gate electrode of the third MOS transistor T3 is connected to the first terminal of the seventh MOS transistor T7.

Due to this interconnection of the third MOS transistor T3 and of the seventh MOS transistor T7, the part of the circuit in which a low voltage level is present is in each case pulled to the potential of the second supply voltage source VSS.

An eighth MOS transistor T8 is provided which is, for example, an n-channel transistor. The first terminal of the eighth MOS transistor T8 is connected to the second terminal of the fifth MOS transistor T5 and to the second terminal of the sixth MOS transistor T6. The second terminal of the eighth MOS transistor T8 is connected to earth potential. The second control signal S2 is applied via the gate electrode of the eighth MOS transistor T8.

The fourth MOS transistor T4 and the eighth MOS transistor T8 are turned on by applying the second control signal S2 with high level. As a result, the second terminal of the first MOS transistor T1 and the second terminal of the fifth MOS transistor T5 are connected to earth potential. This causes the information latched in the circuit arrangement to be cleared.

When the input signal assumes the value of a logic 1, the second MOS transistor T2 and the first inverter I1 act as storage element. If the input signal assumes the value of a logic 0, the sixth MOS transistor T6 and the fourth inverter I4 act as storage element.

In the circuit arrangement according to the invention, the low voltage level is provided by corresponding connection to the second supply voltage source VSS and the high voltage level is provided by corresponding connection to the first supply voltage VDD for the output signal and for the inverted output signal. In addition, the two mutually inverted circuit branches are locked with respect to one another.

The circuit arrangement is suitable as address latch for a 16M-DRAM memory.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit arrangement for latching one bit, comprising:

first and second circuit branches having a common input;

said first circuit branch having a first MOS transistor and a first inverter, which are connected in series between the input and a first output;

when a first control signal is present, the first MOS transistor switching an input signal corresponding to the bit to an input of the first inverter;

a second MOS transistor which is a p-channel transistor and which is acted upon by an output of the first inverter, the second MOS transistor being switched between the input of the first inverter and a first supply voltage source which supplies a first potential corresponding to a higher level;

a third MOS transistor, which is an n-channel transistor, the third MOS transistor being switched between the input of the first inverter and a second supply voltage source which supplies a second potential corresponding to a low level;

a fourth MOS transistor which clears a signal present at the input of the first inverter when a second control signal is present;

said second circuit branch having a third inverter, a fifth MOS transistor and a fourth inverter, which are connected in series between the input and a second output;

the fifth MOS transistor being acted upon by the first control signal and, when the first control signal is present, connecting an output of the third inverter to an input of the fourth inverter;

a sixth MOS transistor, which is a p-channel transistor and which is acted upon by an output of the fourth inverter, the sixth MOS transistor being switched between the input of the fourth inverter and the first supply voltage source;

a seventh MOS transistor, which is an n-channel transistor, the seventh MOS transistor being switched between the input of the fourth inverter and the second supply voltage source;

an eighth MOS transistor, which is acted upon by the second control signal and which, when the second control signal is present, clears a signal present at the input of the fourth inverter;

a gate of the third MOS transistor being connected to the input of the fourth inverter and to the sixth MOS transistor; and a gate of the seventh MOS transistor being connected to the input of the first inverter and to the second MOS transistor.

2. The circuit arrangement according to claim 1, wherein the circuit arrangement further comprises a second inverter which is switched between the output of the first inverter and the first output, and a fifth inverter which is switched between the output of the fourth inverter and the second output.

3. The circuit arrangement according to claim 1, wherein each of the first MOS transistor, the fourth MOS transistor, the fifth MOS transistor and the eighth MOS transistor are n-channel transistors.

4. The circuit arrangement according to claim 1, wherein the circuit arrangement is an address latch.

* * * * *